United States Patent
Zhang et al.

(10) Patent No.: US 10,290,277 B2
(45) Date of Patent: May 14, 2019

(54) RESET CIRCUIT, SHIFT REGISTER CIRCUIT, GATE DRIVING CIRCUIT, DISPLAY APPARATUS, AND DRIVING METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yang Zhang, Beijing (CN); Chengying Cao, Beijing (CN); Peng Li, Beijing (CN); Peng Wu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/770,904

(22) PCT Filed: Sep. 29, 2017

(86) PCT No.: PCT/CN2017/104393
§ 371 (c)(1),
(2) Date: Apr. 25, 2018

(87) PCT Pub. No.: WO2018/171162
PCT Pub. Date: Sep. 27, 2018

(65) Prior Publication Data
US 2019/0057666 A1 Feb. 21, 2019

(51) Int. Cl.
*G11C 19/28* (2006.01)
*G09G 3/36* (2006.01)

(52) U.S. Cl.
CPC ............ *G09G 3/3677* (2013.01); *G11C 19/28* (2013.01); *G11C 19/287* (2013.01); *G09G 2310/0286* (2013.01)

(58) Field of Classification Search
CPC .. G09G 3/3266; G09G 3/3674; G09G 3/3677; G09G 2310/0286; G11C 19/28; G11C 19/287
See application file for complete search history.

(56) References Cited

U.S. PATENT DOCUMENTS

| 5,448,528 | A | 9/1995 | Nagai | |
|---|---|---|---|---|
| 8,872,745 | B2* | 10/2014 | Umezaki | G11C 19/28 345/98 |

(Continued)

FOREIGN PATENT DOCUMENTS

| CN | 102682699 A | 9/2012 |
|---|---|---|
| CN | 103208263 A | 7/2013 |

(Continued)

OTHER PUBLICATIONS

International Search Report and Written Opinion from PCT Application Serial No. PCT/CN2017/104393, dated Dec. 28, 2017, 16 pages.

*Primary Examiner* — Patrick O Neill
(74) *Attorney, Agent, or Firm* — Kinney & Lange, P.A.

(57) ABSTRACT

The present application provides a reset circuit for a shift register circuit, a shift register circuit, a gate driving circuit, a display apparatus, and a driving method. The reset circuit comprises a first adjustment control circuit having an input terminal configured to receive a ground line signal, and a control terminal configured to receive a first control signal; a second adjustment control circuit having an input terminal configured to receive an adjustment signal via an adjustment signal input terminal, a control terminal configured to receive a second control signal, and an output terminal (Continued)

configured to be coupled to an output terminal of the first adjustment control circuit; and a storage circuit having a first terminal connected to the output terminals of the second adjustment control circuit and the first adjustment control circuit, and a second terminal connected between a reset signal input terminal and a transistor.

13 Claims, 9 Drawing Sheets

(56) References Cited

U.S. PATENT DOCUMENTS

| | | | |
|---|---|---|---|
| 9,305,522 B2 * | 4/2016 | Tu | G11C 19/00 |
| 10,026,373 B2 * | 7/2018 | Chen | G06F 3/0412 |
| 2015/0280704 A1 | 10/2015 | Wu et al. | |
| 2016/0247477 A1 | 8/2016 | Hu et al. | |

FOREIGN PATENT DOCUMENTS

| | | |
|---|---|---|
| CN | 104282282 A | 1/2015 |
| CN | 104916249 A | 9/2015 |
| CN | 106023932 A | 10/2016 |

\* cited by examiner

RESET CIRCUIT, SHIFT REGISTER CIRCUIT, GATE DRIVING CIRCUIT, DISPLAY APPARATUS, AND DRIVING METHOD

CROSS-REFERENCE TO RELATED APPLICATION(S)

This application corresponds to PCT/CN2017/104393, and claims priority to the Chinese Patent Application No. 201710181053.1, filed on Mar. 24, 2017, which is incorporated herein by reference in its entirety.

TECHNICAL FIELD

The present disclosure relates to a field of display technology, and more particularly, to a reset circuit, a shift register circuit, a gate driving circuit, a display apparatus, and a driving method.

BACKGROUND

A display apparatus may comprise a gate driving circuit for driving a pixel circuit, for example, a gate driving circuit using a Gate on Array (GOA) technology. The gate driving circuit may comprise cascaded shift register circuits (referred to as SR circuits, or gate driving circuits or GOA circuits), in which an input clock signal is converted by the shift register circuits and is then applied to gate lines of various rows of pixels of the display apparatus in sequence, to control display of the display apparatus row by row. In an arrangement of the gate driving circuit, it needs to use an output from a certain next stage of shift register circuit to reset a certain previous stage of shift register circuit. For example, in a case that a single stage of shift register circuit is used as a group to turn on only one row of pixel circuits at the same time, for an $n^{th}$ stage of shift register circuit, it needs to use an output from an $(n+1)^{th}$ stage of shift register circuit as a reset input of the $n^{th}$ stage of shift register circuit.

However, for last stages of shift register circuits, for example, a last stage of shift register circuit in the above exemplary case, there are no other shift register circuits next to the last stage of shift register circuit, and therefore separate reset shift register circuits need to be provided to implement such a reset function, which may adversely affect operation characteristics of the last stages of shift register circuits.

SUMMARY

According to an aspect of the present disclosure, the embodiments of the present disclosure propose a reset circuit for a shift register circuit. The reset circuit comprises a first adjustment control circuit having an input terminal, an output terminal and a control terminal, wherein the input terminal is configured to receive a ground line signal via a ground input terminal, and the control terminal is configured to receive a first control signal; a second adjustment control circuit having an input terminal, an output terminal and a control terminal, wherein the input terminal is configured to receive an adjustment signal via an adjustment signal input terminal, the control terminal is configured to receive a second control signal, and the output terminal is coupled to an output terminal of the first adjustment control circuit; and a storage circuit having a first terminal coupled to the output terminal of the first adjustment control circuit and the output terminal of the second adjustment control circuit, and a second terminal coupled to a reset signal input terminal for receiving a reset signal and a transistor of the shift register circuit for receiving a reset input.

In an example, the first adjustment control circuit and the second adjustment control circuit each comprise thin film transistors and the storage circuit comprises a capacitor.

In an example, in the first adjustment control circuit, the input terminal comprises one of a source and a drain, the output terminal comprises the other of the source and the drain, and the control terminal comprises a gate; and in the second adjustment control circuit, the input terminal comprises one of a source and a drain, the output terminal comprises the other of the source and the drain, and the control terminal comprises a gate.

In an example, the first control signal is in phase with a gate driving input signal of the shift register circuit, and the second control signal is in phase with the reset signal.

In an example, the first control signal comprises the gate driving input signal, and the second control signal comprises the reset signal.

In an example, the adjustment signal comprises a constant direct current level adjustment signal.

In an example, the reset signal input terminal is configured to receive a reset signal from another shift register circuit.

According to another aspect of the present disclosure, there is provided a shift register circuit. The shift register circuit comprises the reset circuit according to the above various embodiments.

According to another aspect of the present disclosure, the embodiments of the present disclosure provide a gate driving circuit. The gate driving circuit comprises N cascaded shift register circuits, wherein K shift register circuits among the N shift register circuits are the shift register circuits according to the present disclosure, where N and K are positive integers and the K shift register circuits are (N−2K+1)th to (N−K)th shift register circuits among the N shift register circuits.

In an example, in a reset circuit of each of the K shift register circuits, the reset signal input terminal receives a reset signal from a Kth stage of shift register circuit subsequent to the current shift register circuit.

According to another aspect of the present disclosure, the embodiments of the present disclosure provide a display apparatus. The display apparatus comprises the gate driving circuit according to the present disclosure.

According to another aspect of the present disclosure, the embodiments of the present disclosure provide a driving method for driving the reset circuit according to the present disclosure, wherein the first terminal of the storage circuit is coupled to the output terminals of the first adjustment control circuit and the second adjustment control circuit at a first node, and the second terminal of the storage circuit is coupled to a second node. The driving method comprises: turning on the first adjustment control circuit during a first period under controlling of the first control signal, so that a voltage at the first node is zero; turning off the first adjustment control circuit during a second period under controlling of the first control signal; and turning on the second adjustment control circuit during a third period under controlling of the second control signal, so that the voltage at the first node is equal to a voltage of the adjustment signal, while inputting, through the reset signal input terminal, the reset signal, so that a voltage at the second node is equal to a voltage of the reset signal minus the voltage of the adjustment signal.

In an example, the first period, the second period and the third period are equal to ½ clock cycle respectively.

DETAILED DESCRIPTION

The specific embodiments of the present disclosure will be described in detail below. It should be noted that the embodiments described herein are used for illustration only, without limiting the present disclosure. In the description below, a number of specific details are explained to provide better understanding of the present disclosure. However, it is apparent to those skilled in the art that the present disclosure can be implemented without these specific details. In other instances, well known structures, materials or methods are not described specifically so as not to obscure the present disclosure.

Throughout the specification, the reference to "one embodiment," "an embodiment," "one example" or "an example" means that the specific features, structures or properties described in conjunction with the embodiment or example are included in at least one embodiment of the present disclosure. Therefore, the phrases "in one embodiment," "in an embodiment," "in one example" or "in an example" occurred in various positions throughout the specification may not necessarily refer to the same embodiment or example. Furthermore, specific features, structures or properties may be combined into one or more embodiments or examples in any appropriate combination and/or sub-combination. In addition, it should be understood by those of ordinary skill in the art that the accompanying drawings provided herein are for illustration purposes only and the accompanying drawings are not necessarily drawn to scale. Moreover, it should be understood by those skilled in the art that the term "and/or" used herein means any and all combinations of one or more listed items.

The present disclosure will be described in detail below with reference to accompanying drawings.

In the related art, the reset shift register circuits are not coupled to a gate load in an active area as the previous shift register circuits and thus generating a reset signal with a large voltage.

Figure 1:
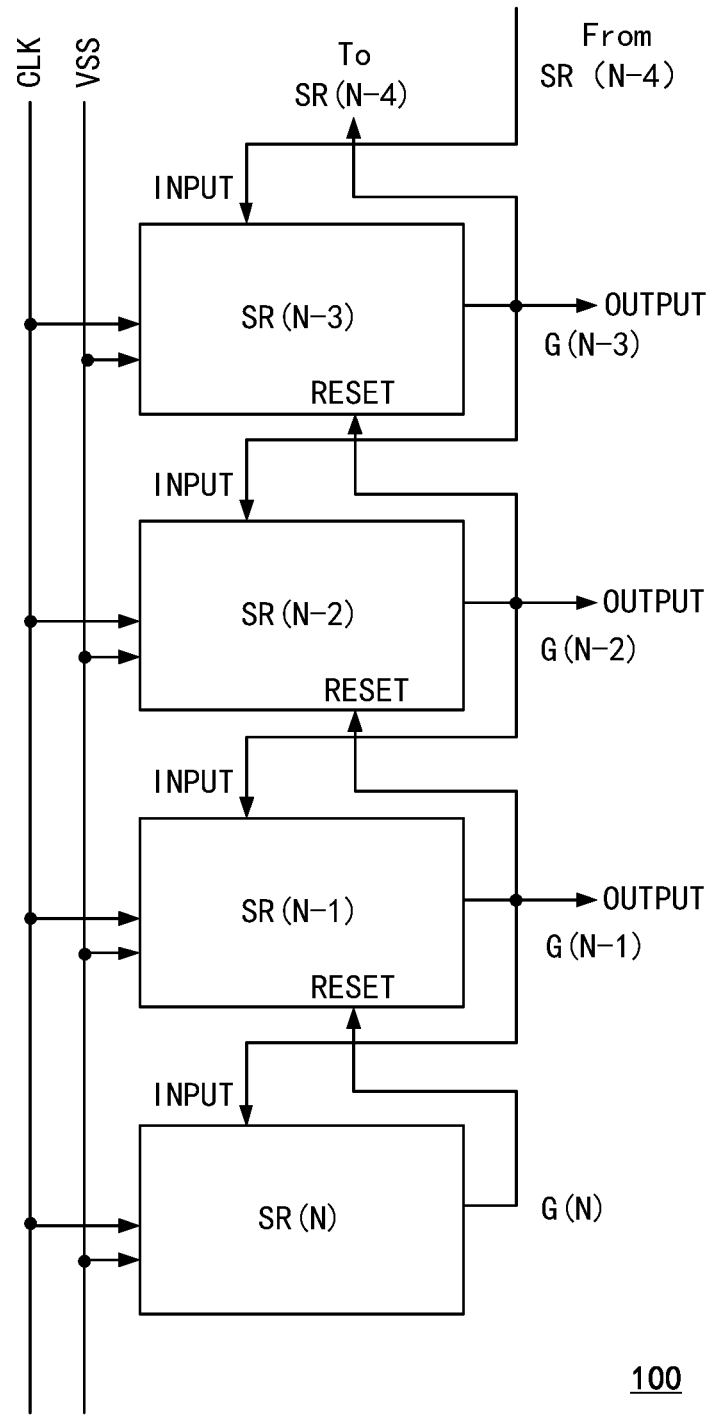
FIG. 1 illustrates a cascade diagram of a gate driving circuit.
Figure 2:
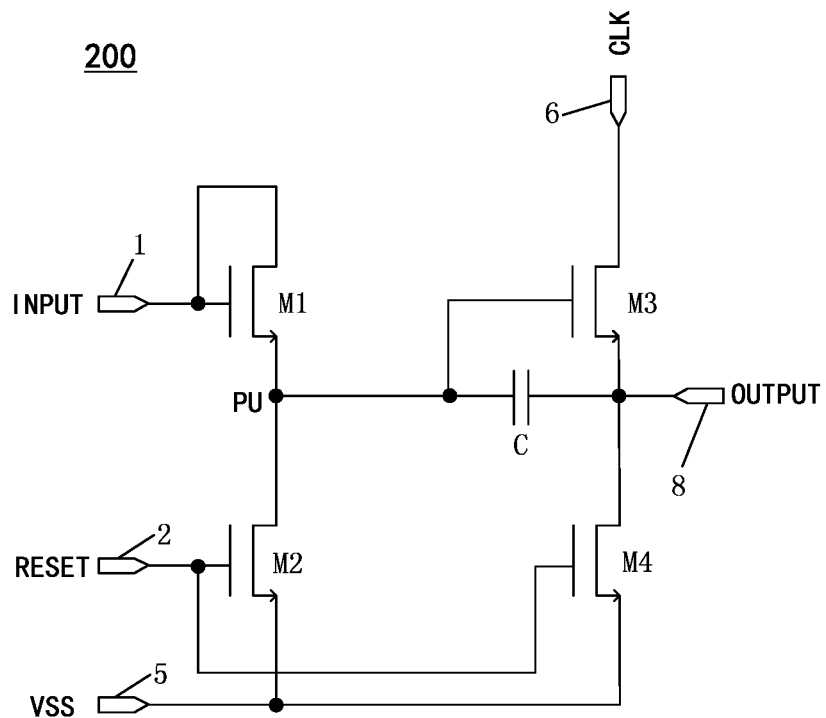
FIG. 2 illustrates a circuit structural diagram of a shift register circuit.

FIG. 1 illustrates a cascade diagram of an exemplary gate driving circuit 100. FIG. 2 illustrates a circuit structural diagram of an exemplary shift register circuit 200.

A single row of pixels is turned on at the same time in FIG. 1, and therefore when shift register circuits are grouped, only a single shift register is included in each group. The gate driving circuit 100 shown in FIG. 1 comprises N stages of shift register circuits. For convenience of description, only last four stages of shift register circuits SR(N−3)-SR(N) are shown. The shift register circuit SR(N) is the last stage, which, as an additional reset shift register circuit, is not coupled to a pixel load. In the gate driving circuit 100, each stage of shift register circuit is implemented as a shift register circuit 200 except for the last stage of shift register circuit SR(N).

For example, the shift register circuit 200 comprises a first input terminal 1 configured to receive a gate driving input signal INPUT, a second input terminal 2 configured to receive a reset signal RESET, and an output terminal 8 configured to output an output signal OUTPUT. The output signal OUTPUT which is output at the output terminal 8 is a gate scanning signal for the shift register circuit 200.

For any stage of shift register circuit 200 in the gate driving circuit 100, for example, the shift register circuit SR(N−1) in FIG. 1, it receives an input signal INPUT which is an output signal OUTPUT(G(N−2)) from a previous stage of shift register circuit (SR(N−2)), and it receives a reset signal RESET which is an output signal OUTPUT(G(N)) from a next stage of shift register circuit (SR(N)).

The shift register circuit 200 may comprise four transistors and one capacitor, i.e., a first transistor M1, a second transistor M2, a third transistor M3, a fourth transistor M4, and a capacitor C.

For example, a gate and a source of the first transistor M1 are coupled to each other and are coupled to the first input terminal 1.

The second transistor M2 has a gate coupled to the second input terminal 2, and a drain coupled to a low level terminal 5 and configured to receive a low level signal VSS.

A drain of the first transistor M1 and a source of the second transistor M2 are coupled to a pull-up node PU.

A gate of the third transistor M3 is coupled to a clock terminal 6 and is configured to receive a clock signal CLK. The gate of M3 is coupled to the output terminal 8 via the capacitor C.

The fourth transistor M4 has a gate also coupled to the second input terminal 2, a drain also coupled to the low level terminal 5, and a source connected to the output terminal 8.

Figure 3:
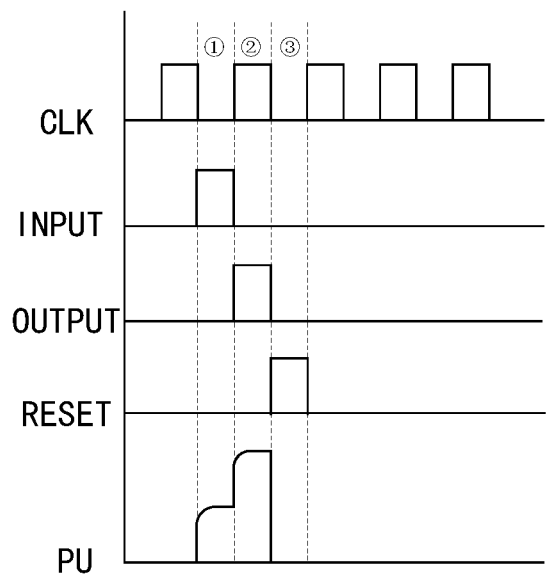
FIG. 3 illustrates a signal timing diagram of the shift register circuit shown in FIG. 2.

FIG. 3 illustrates a signal timing diagram of the shift register circuit 200. One period in FIG. 3 is one half of a clock cycle.

Firstly, in a period ①, when output from a previous stage of shift register circuit is performed, an input signal INPUT of a current stage of shift register circuit 200 is at a high level, and the first transistor M1 is turned on to pre-charge the pull-up node PU.

Next, in a period ②, a clock signal CLK of the current stage of shift register circuit 200 is at a high level, and the third transistor M3 is turned on, so that an output signal OUTPUT at the output terminal 8 is at a high level. At the same time, a potential at the pull-up node PU increases again due to the bootstrap effect.

Then, in a period ③, an output signal output by a next stage of shift register circuit is at a high level, i.e., a reset signal RESET received at the second input terminal 2 is at a high level, and the second transistor M2 and the fourth transistor M4 are turned on, so that the pull-up node PU and the output terminal 8 are discharged to be reset.

A last stage of shift register circuit SR(N) in the gate driving circuit 100 does not have a pixel load, so that a reset signal RESET with a large voltage is generated by the last stage of shift register circuit SR(N) for a previous stage of shift register circuit SR(N−1), which may have an adverse effect on the performance of SR(N−1).

Figure 4:
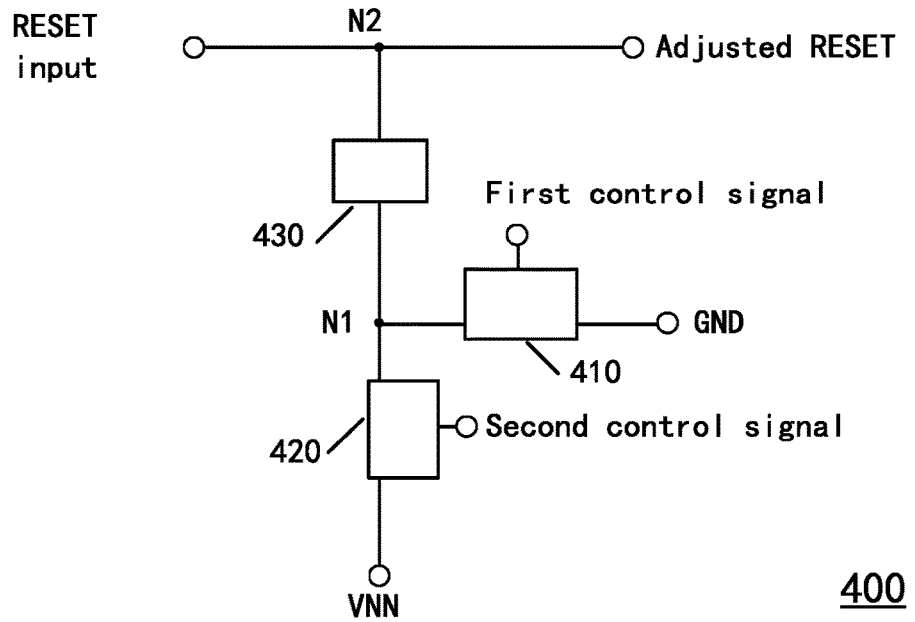
FIG. 4 illustrates a circuit structural diagram of a reset circuit according to an embodiment of the present disclosure.

FIG. 4 illustrates a circuit structural diagram of a reset circuit 400 according to an embodiment of the present disclosure. The reset circuit 400 may be applied to various shift register circuits, for example, a shift register circuit which may receive the reset signal RESET with a large voltage as described above, such as SR(N−1) in FIG. 3, so as to controllably reduce a voltage value of a reset signal which is actually applied to an element (for example, the second transistor M2 in FIG. 2) in the shift register circuit.

As shown in FIG. 4, the reset circuit 400 according to the embodiment of the present disclosure comprises a first adjustment control circuit 410, a second adjustment control circuit 420, and a storage circuit 430.

The first adjustment control circuit 410 has an input terminal configured to receive a ground line signal GND via a ground input terminal and a control terminal configured to receive a first control signal.

The second adjustment control circuit 420 has an input terminal configured to receive an adjustment signal VNN via an adjustment signal input terminal, a control terminal configured to receive a second control signal, and an output terminal coupled to an output terminal of the first adjustment control circuit 410 at, for example, a first node shown in FIG. 4.

The storage circuit 430 has a first terminal coupled to the first node N1, and a second terminal coupled between a reset signal input terminal for receiving a reset signal RESET from another shift register circuit (a certain stage of shift register circuit subsequent to a shift register circuit where the reset circuit 400 is located, for example, in a case that a row of pixels is turned on each time, a next stage of shift register circuit of the shift register circuit where the reset circuit 400 is located) and a transistor for receiving a reset input in the shift register circuit where the reset circuit 400 is located, for example, at a second node N2 shown in FIG. 4.

In an embodiment, the first control signal is in phase with a gate driving input signal of the shift register circuit where the reset circuit 400 is located, and the second control signal is in phase with the reset signal RESET.

In an embodiment, the first control signal is the gate driving input signal and the second control signal is the reset signal RESET.

In an embodiment, the adjustment signal VNN is a constant direct current level adjustment signal. In another embodiment, a voltage of the adjustment signal VNN may be changed as needed to controllably reduce a voltage value of a reset signal which is actually applied to a key element in the shift register circuit.

Figure 5:
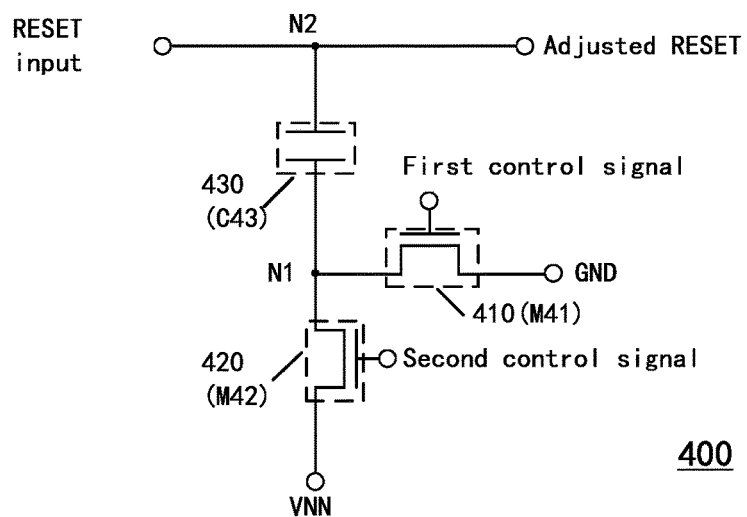
FIG. 5 illustrates a more detailed circuit structural diagram of the reset circuit shown in FIG. 4.

FIG. 5 illustrates a more detailed circuit structural diagram of the reset circuit 400 shown in FIG. 4.

It can be seen from FIG. 5 that, the first adjustment control circuit 410 and the second adjustment control circuit 420 comprise thin film transistors M41 and M42, respectively. The storage circuit 430 comprises a capacitor C43.

In an embodiment, the input terminal of the first adjustment control circuit 410 is one of a source and a drain of M41, the output terminal of the first adjustment control circuit 410 is the other of the source and the drain of M41, and the control terminal of the first adjustment control circuit 410 is a gate of M41. Similarly, the input terminal of the second adjustment control circuit 420 is one of a source and a drain of M42, the output terminal of the second adjustment control circuit 420 is the other of the source and the drain of M42, and the control terminal of the second adjustment control circuit 420 is a gate of M42.

Figure 6:
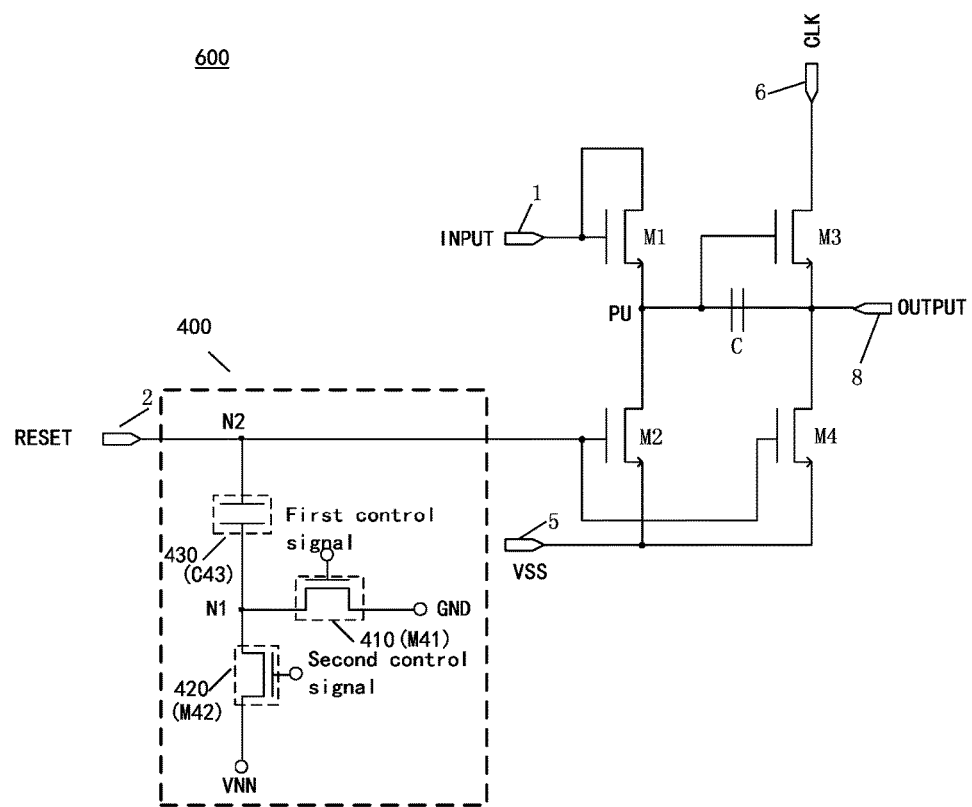
FIG. 6 illustrates a circuit structural diagram of a shift register circuit according to an embodiment of the present disclosure.

FIG. 6 illustrates a circuit structural diagram of a shift register circuit 600 according to an embodiment of the present disclosure. The shift register circuit 600 comprises a circuit structure of the reset circuit 400 shown in FIG. 4 (or FIG. 5) and a shift register circuit (for example, the shift register circuit 200 shown in FIG. 2). It should be understood that although the reset circuit 400 is combined in FIG. 6 with the shift register circuit 200 in FIG. 2, it is exemplary only, and the present disclosure does not limit the specific structure of the shift register circuit combined with the reset circuit 400. In other embodiments, the reset circuit 400 may also be combined with other types of shift register circuits to implement the shift register circuit according to the present disclosure which is capable of reducing a reset signal applied a key component. In addition, a more detailed exemplary circuit structure of the reset circuit 400 is shown in FIG. 6 for convenience of description.

In the circuit structure of FIG. 6, a reset signal RESET received at the second input terminal 2 is reduced at the second node N2 by the reset circuit 400, thereby improving negative effects on the second transistor M2 by the reset signal which is finally applied to the second transistor M2.

Figure 7:
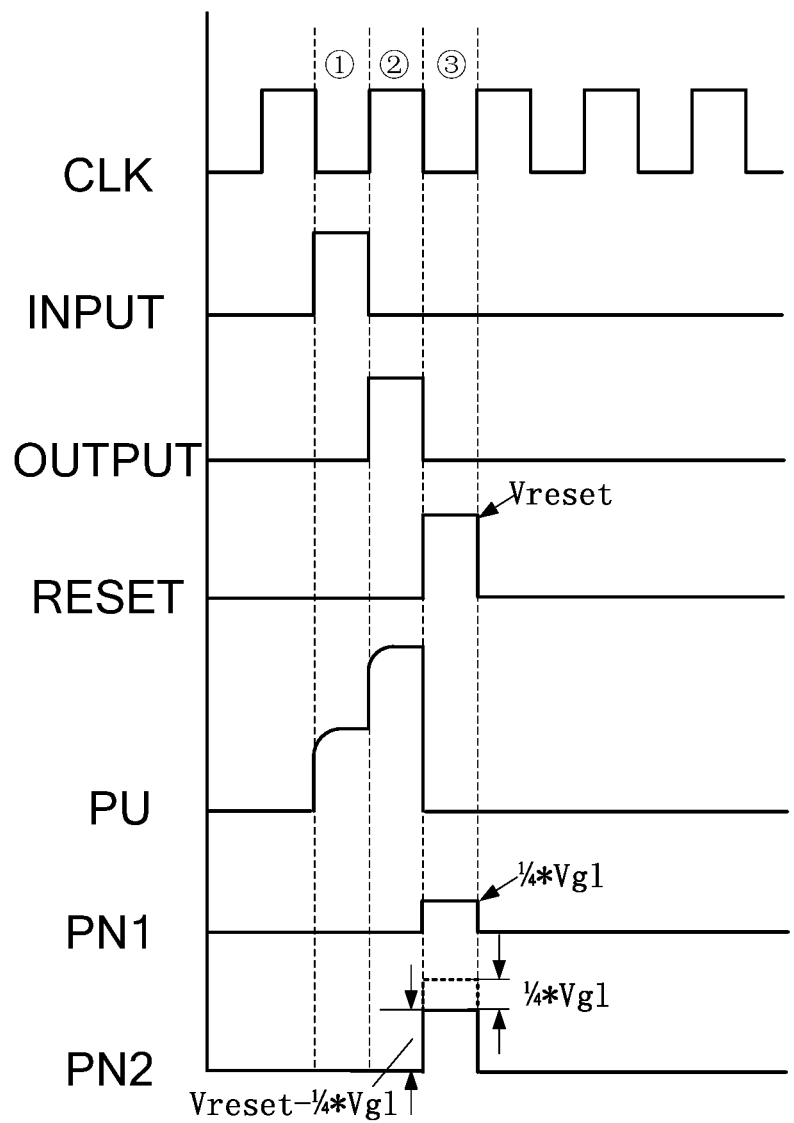
FIG. 7 illustrates a signal timing diagram of the shift register circuit shown in FIG. 6.

FIG. 7 illustrates a signal timing diagram of the shift register circuit 600. One period in FIG. 7 is one half of a clock cycle. A timing operation of the shift register circuit 600 shown in FIG. 6 will be described below with reference to FIG. 7.

Firstly, in a period ①, as the start of an operation period of the shift register circuit 600 in one frame, an input signal INPUT is at a high level. A first control signal is in phase with INPUT and is therefore also at a high level. Thus, the transistor M41 is turned on and a voltage PN1 at the first node N1 is equal to 0V. At this time, a clock signal CLK of the shift register circuit 600 is at a low level, and a reset signal RESET received by the shift register circuit 600 is also at a low level, so that the transistor M42 is turned off.

Next, in a period ②, the clock signal CLK of the shift register circuit 600 is at a high level, and then the third transistor M3 is turned on, so that an output signal OUTPUT at the output terminal 8 is at a high level, which means that an input to a shift register circuit which is to provide the shift register circuit 600 with the RESET signal is at a high level. At this time, the input signal INPUT of the shift register circuit 600 is no longer at a high level, then the transistor M41 is turned off, and the voltage PN1 at the first node N1 remains at 0V.

Then, in a period ③, an output from the shift register circuit which is to provide the shift register circuit 600 with the RESET signal is at a high level, i.e., the reset signal RESET received at the second input terminal 2 is at a high level. As the second control signal is in phase with the reset signal RESET, it is also at a high level, then the transistor M42 is turned on, and the voltage PN1 at the first node N1 becomes a voltage of VNN, for example, ¼*Vgl, where Vgl is a low voltage of the gate of the transistor M42. At this time, under the action of the capacitor C43, the voltage PN2 at the second node N2 is Vreset-VNN, i.e., Vreset-¼*Vgl, rather than Vreset, which causes the voltage at the second node N2 to decrease. That is, the voltage applied to the gate of the second transistor M2 is reduced by ¼*Vgl compared to that before the reset circuit 400 is provided. Thus, the voltage applied to the gate of the second transistor M2 may be adjusted by changing magnitude of the voltage of VNN which is ¼*Vgl.

Figure 8:
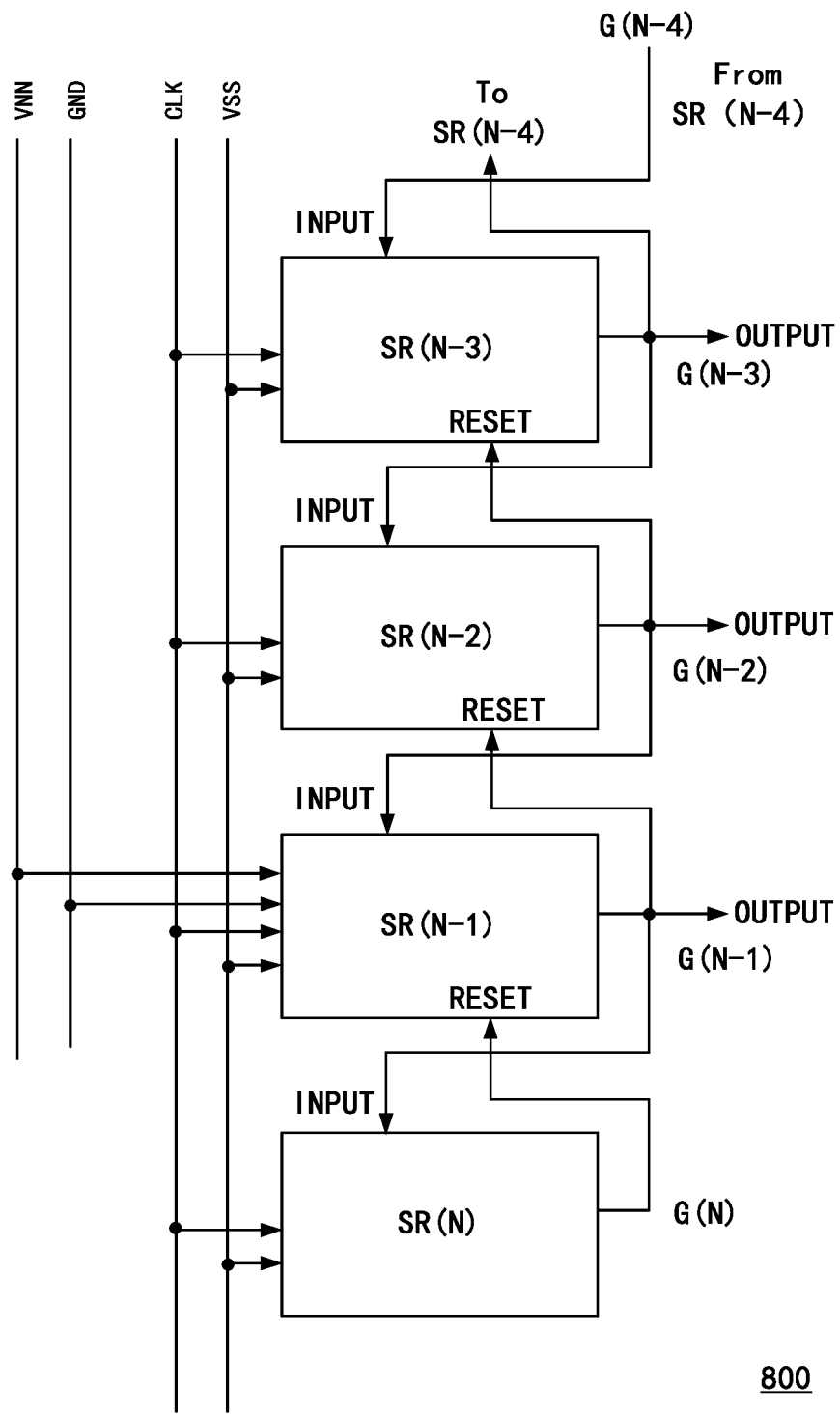
FIG. 8 illustrates a cascade diagram of a gate driving circuit according to an embodiment of the present disclosure.

FIG. 8 illustrates a cascade diagram of a gate driving circuit 800 according to an embodiment of the present disclosure. In order to be compared with the structure of the gate driving circuit 100 in FIG. 1, similarly to FIG. 1, only a single shift register circuit is included in each group of shift register circuits, that is, only a row of pixels corresponding to a single shift register circuit is turned on at the same time. The gate driving circuit 800 differs from the gate driving circuit 100 of FIG. 1 in that a last but one stage of shift register circuit SR(N−1) is implemented as a shift register circuit having the reset circuit 400, for example, the shift register circuit 700 in FIG. 7. Thus, the shift register circuit SR(N−1) further receives GND and VNN to implement the function of the reset circuit 400.

It should be understood that although only a situation in which a single shift register circuit is included in each group is shown in FIG. 8, this is exemplary only, and in other embodiments, continuous multiple stages of shift register circuits may also be included in each group, so that multiple rows of pixels corresponding to multiple stages of shift register circuits in one group may be turned on at the same time. At this time, it needs to additionally provide a group of reset shift registers having the same number as that of the shift register units to reset a last group of shift registers which are applied to an active area, and in order to reduce a reset voltage applied to the group of shift registers, it needs to implement all the shift register circuits in this group as shift register circuits having the reset circuit 400.

In general, for a gate driving circuit including N cascaded shift register circuits, if each group of shift register circuits comprises K stages of shift register circuits, where N and K are positive integers, a last but one group of K shift register circuits (i.e., $(N-2K+1)^{th}$ shift register circuit to $(N-K)^{th}$ shift register circuit) in the N stages of shift register circuits is implemented as shift register circuits having the reset circuit 400.

Figure 9:
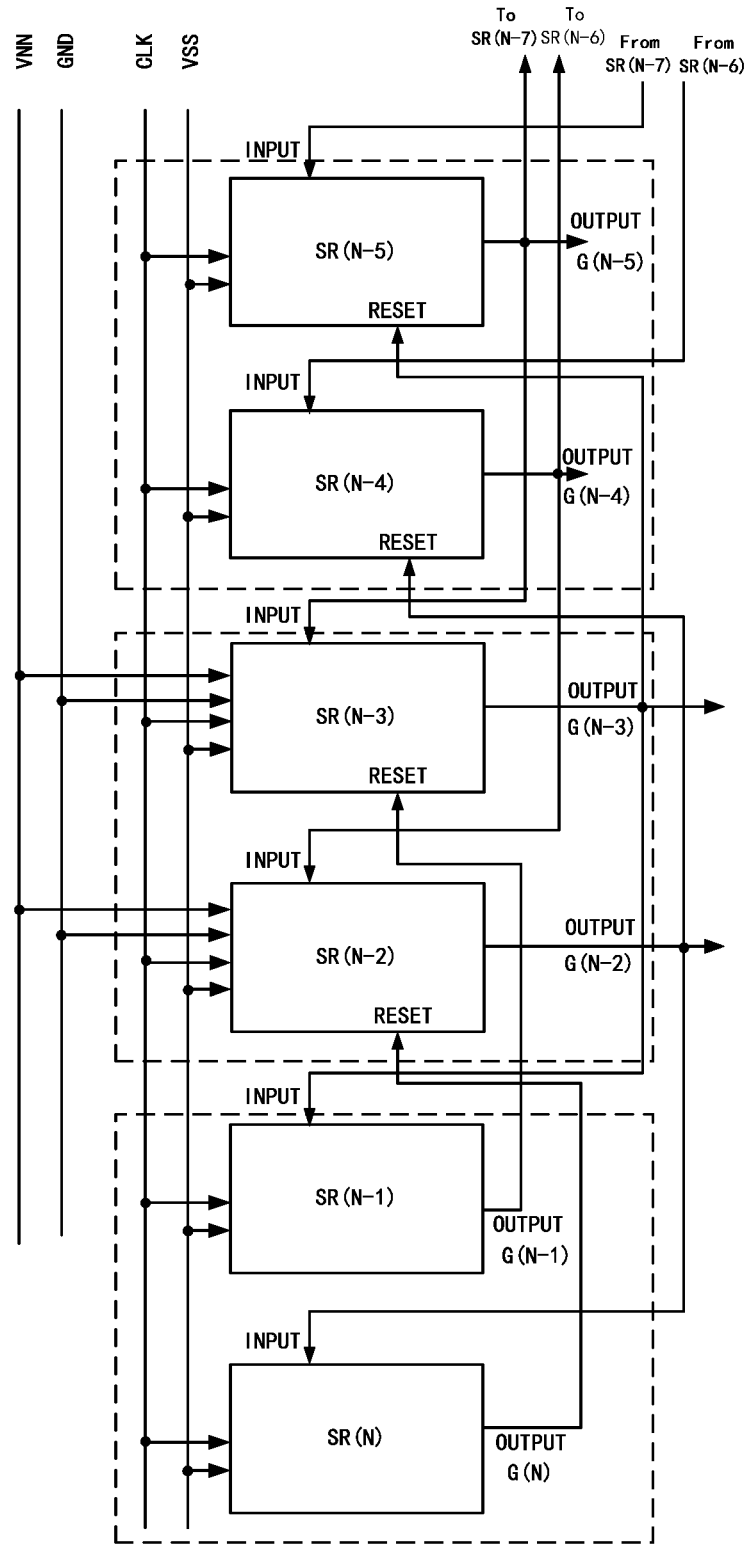
FIG. 9 illustrates a cascade diagram of a gate driving circuit according to another embodiment of the present disclosure.

As an example, a situation in which a gate driving circuit including two stages of shift register circuits per group is shown in FIG. 9. The gate driving circuit in FIG. 9 comprises N stages of shift register circuits, only last six stages of which are shown as an example, and are divided into three groups as illustrated by the dashed box, wherein each group comprises two stages of shift register circuits.

For each group of shift register circuits (not the last group), a first stage of shift register circuit in the group uses an output OUTPUT from a first stage of shift register circuit in a previous group as an input INPUT, and uses an output OUTPUT from a first stage of shift register circuit in a next group as a reset input RESET. Similarly, a second stage of shift register circuit in the group uses an output OUTPUT from a second stage of shift register circuit in a previous group as an input INPUT, and uses an output OUTPUT from a second stage of shift register circuit in a next group as a reset input RESET.

A last group of shift register circuits SR(N−1) and SR(N) is not coupled to a pixel load as additional reset shift registers, and is only used to reset a last but one group of shift register circuits SR(N−2) and SR(N−3). Thus, the last but one group of shift register circuits SR(N−2) and SR(N−3) is implemented as shift register circuits having the reset circuit 400 (FIG. 4 or FIG. 5) to reduce a reset voltage applied to a key element (for example, the second transistor M2 in FIG. 2) therein.

Figure 10:
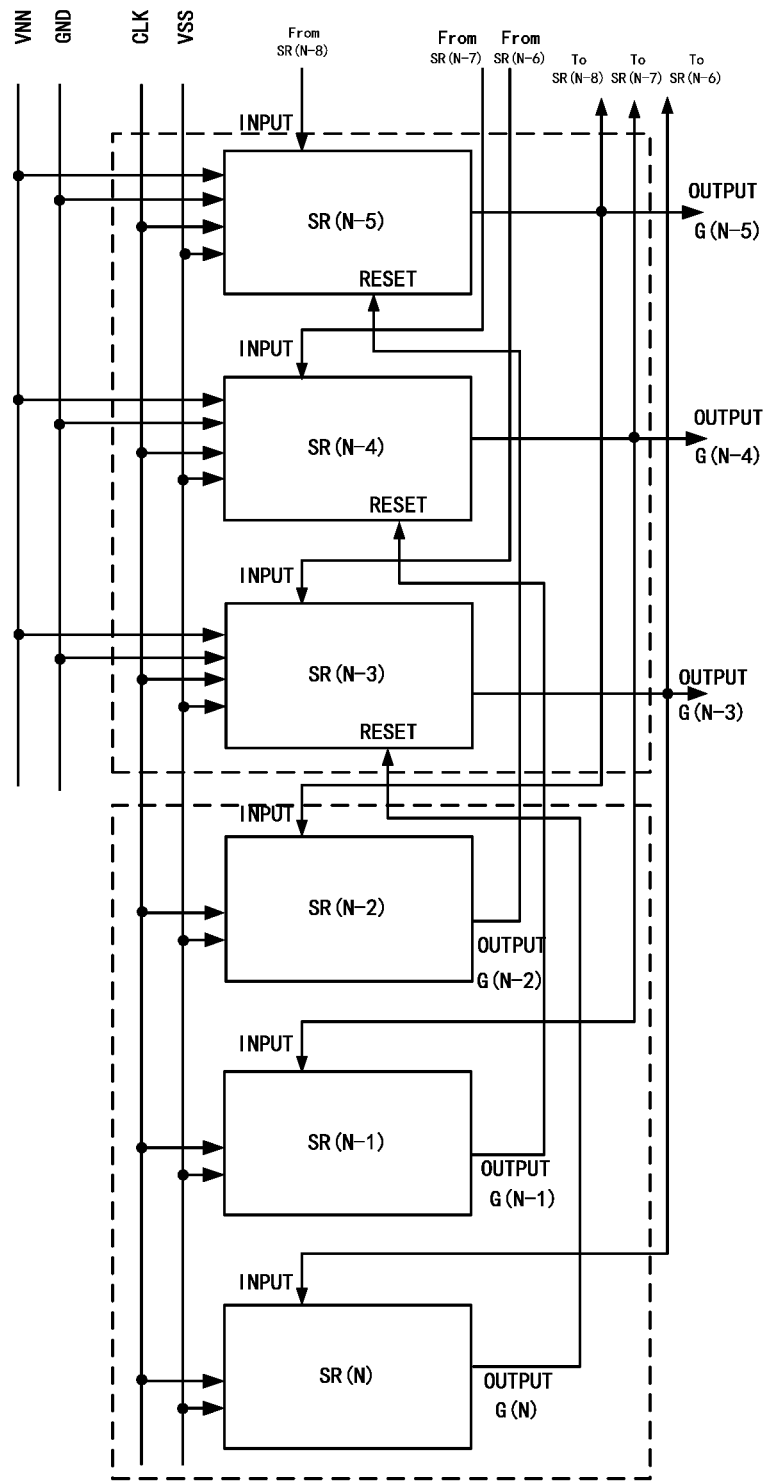
FIG. 10 illustrates a cascade diagram of a gate driving circuit according to another embodiment of the present disclosure.

As another example, a situation in which a gate driving circuit including three stages of shift register circuits per group is shown in FIG. 10. The gate driving circuit in FIG. 10 comprises N stages of shift register circuits, only last six stages of which are shown as an example, and are divided into two groups as illustrated by the dashed box, wherein each group comprises three stages of shift register circuits.

For each group of shift register circuits (not the last group), a first stage of shift register circuit in the group uses an output OUTPUT from a first stage of shift register circuit in a previous group as an input INPUT, and uses an output OUTPUT from a first stage of shift register circuit in a next group as a reset input RESET. Similarly, a second stage of shift register circuit in the group uses an output OUTPUT from a second stage of shift register circuit in a previous group as an input INPUT, and uses an output OUTPUT from a second stage of shift register circuit in a next group as a reset input RESET, and a third stage of the shift register circuit in the group uses an output OUTPUT from a third stage of shift register circuit in a previous group as an input INPUT, and uses an output OUTPUT from a third stage of shift register circuit in a next group as a reset input RESET.

A last group of shift register circuits SR(N−2), SR(N−1) and SR(N) is not coupled to the pixel load as additional reset shift registers, and is only used to reset a last but one group of shift register circuits SR(N−5), SR(N−4) and SR(N−3). Thus, the last but one group of shift register circuits SR(N−5), SR(N−4) and SR(N−3) is implemented as shift register circuits having the reset circuit 400 (FIG. 4 or FIG. 5) to reduce a reset voltage applied to a key element (for example, the second transistor M2 in FIG. 2) therein.

Figure 11:
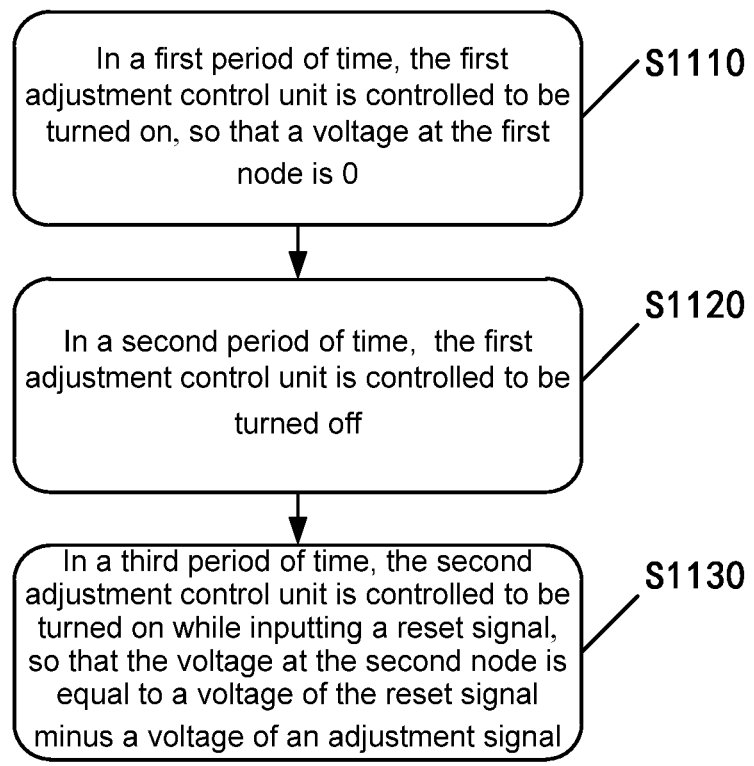
FIG. 11 illustrates a flowchart of a driving method of a reset circuit according to an embodiment of the present disclosure.

FIG. 11 illustrates a flowchart of a driving method 1100 of a reset circuit (for example, the reset circuit 400 shown in FIG. 4 and/or FIG. 5) according to an embodiment of the present disclosure. As an example, the following description is made with reference to the circuit structure in FIG. 5.

The driving method 1100 comprises the following steps S1110-S1130.

In S1110, in a first period (for example, the period ① in FIG. 7), the transistor M41 is controlled to be turned on by a first control signal, so that a voltage PN1 at the first node N1 is 0V.

In S1120, in a second period (for example, the period ② in FIG. 7), the transistor M41 is controlled to be turned off by the first control signal. At this time, the voltage PN1 at the first node N1 remains at 0V.

In S1130, in a third period (for example, the period ③ in FIG. 7), the transistor M42 is controlled to be turned on by a second control signal, so that the voltage PN1 at the first node N1 is equal to a voltage of an adjustment signal VNN (for example, ¼*Vgl). At the same time, a reset signal RESET is further input via the reset signal input terminal in this period, so that a voltage at the second node N2 is equal to a voltage Vreset of the reset signal minus the voltage of the adjustment signal which is ¼*Vgl, i.e., PN2=Vreset-¼*Vgl.

The reset circuit, the shift register circuit, and the gate driving circuit according to the present disclosure have been described in detail above. In addition, the present disclosure further provides a display apparatus including the above gate driver. For example, the display apparatus may be a liquid crystal display apparatus such as a liquid crystal panel, a liquid crystal television, a mobile phone, an electronic reader, a liquid crystal display, etc.

Specific embodiments described above further illustrate the purposes, technical solutions and beneficial effects of the present disclosure. It should be understood that the above description is only specific embodiments of the present disclosure and is not intended to limit the present disclosure. Any modification, equivalent substitution, or improvement made within the spirit and principle of the present disclosure shall fall within the protection scope of the present disclosure.

We claim:

1. A reset circuit for a shift register circuit, the reset circuit comprising:
   a first adjustment control circuit having an input terminal, an output terminal, and a control terminal, wherein the input terminal of the first adjustment control circuit is configured to receive a ground line signal via a ground input terminal, and the control terminal of the first adjustment control circuit is configured to receive a first control signal;
   a second adjustment control circuit having an input terminal, an output terminal, and a control terminal, wherein the input terminal of the second adjustment control circuit is configured to receive an adjustment signal via an adjustment signal input terminal, the control terminal of the second adjustment control circuit is configured to receive a second control signal, and the output terminal of the second adjustment control circuit is coupled to the output terminal of the first adjustment control circuit; and
   a storage circuit having a first terminal and a second terminal, wherein the first terminal of the storage circuit is coupled to the output terminal of the first adjustment control circuit and the output terminal of the second adjustment control circuit, and the second terminal of the storage circuit is coupled to a reset signal input terminal for receiving a reset signal and a transistor of the shift register circuit for receiving a reset input.

2. The reset circuit according to claim 1, wherein the first adjustment control circuit and the second adjustment control circuit each comprise thin film transistors and the storage circuit comprises a capacitor.

3. The reset circuit according to claim 2, wherein
   in the first adjustment control circuit, the input terminal comprises one of a source and a drain, the output terminal comprises the other of the source and the drain, and the control terminal comprises a gate; and
   in the second adjustment control circuit, the input terminal comprises one of a source and a drain, the output terminal comprises the other of the source and the drain, and the control terminal comprises a gate.

4. The reset circuit according to claim 1, wherein the first control signal is in phase with a gate driving input signal of the shift register circuit, and the second control signal is in phase with the reset signal.

5. The reset circuit according to claim 4, wherein the first control signal comprises the gate driving input signal, and the second control signal comprises the reset signal.

6. The reset circuit according to claim 1, wherein the adjustment signal comprises a constant direct current level adjustment signal.

7. The reset circuit according to claim 1, wherein the reset signal input terminal is configured to receive a reset signal from another shift register circuit.

8. A shift register circuit comprising the reset circuit according to claim 1.

9. A gate driving circuit comprising N cascaded shift register circuits, wherein K shift register circuits among the N shift register circuits are the shift register circuits according to claim 8, and the K shift register circuits are $(N-2K+1)^{th}$ to $(N-K)^{th}$ shift register circuits among the N shift register circuits, where K and N are positive integers.

10. The gate driving circuit according to claim 9, wherein for a reset circuit of each of the K shift register circuits, the reset signal input terminal receives a reset signal from a $K^{th}$ stage of shift register circuit subsequent to the current shift register circuit.

11. A display apparatus comprising the gate driving circuit according to claim 9.

12. A driving method for driving the reset circuit according to claim 1, wherein the first terminal of the storage circuit is coupled to the output terminal of the first adjustment control circuit and the output terminal of the second adjustment control circuit at a first node, and the second terminal of the storage circuit is coupled to a second node, the driving method comprising:
   turning on the first adjustment control circuit during a first period under controlling of the first control signal, so that a voltage at the first node is zero;
   turning off the first adjustment control circuit during a second period, under controlling of the first control signal; and
   turning on the second adjustment control circuit during a third period, under controlling of the second control signal, so that the voltage at the first node is equal to a voltage of the adjustment signal, while inputting, through the reset signal input terminal, the reset signal, so that a voltage at the second node is equal to a voltage of the reset signal minus the voltage of the adjustment signal.

13. The driving method according to claim 12, wherein the first period, the second period and the third period are equal to ½ clock cycle respectively.

* * * * *